United States Patent
Lee et al.

(10) Patent No.: US 7,597,133 B2
(45) Date of Patent: Oct. 6, 2009

(54) HEAT DISSIPATION DEVICE WITH HEAT PIPES

(75) Inventors: Hsieh-Kun Lee, Guangdong (CN);
Cheng-Tien Lai, Guangdong (CN);
Zhi-Bin Tan, Guangdong (CN);
Zhi-Yong Zhou, Guangdong (CN);
Jiang-Jian Wen, Guangdong (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

(*) Notice: Subject to any disclaimer, the term of this patent is extended or adjusted under 35 U.S.C. 154(b) by 485 days.

(21) Appl. No.: 11/306,359

(22) Filed: Dec. 25, 2005

(65) Prior Publication Data

US 2007/0144709 A1    Jun. 28, 2007

(51) Int. Cl.
*F28F 7/00* (2006.01)
(52) U.S. Cl. ...................................... 165/80.3
(58) Field of Classification Search ................ 165/80.2, 165/80.3, 80.4, 104.21, 104.26, 104.33, 185; 361/697, 698, 700
See application file for complete search history.

(56) References Cited

U.S. PATENT DOCUMENTS

| | | | | |
|---|---|---|---|---|
| 5,699,853 A * | 12/1997 | Goth et al. | ............... | 165/185 |
| 5,901,040 A * | 5/1999 | Cromwell et al. | ......... | 165/80.2 |
| 6,542,364 B2 * | 4/2003 | Lai et al. | ............... | 165/104.33 |
| 6,573,470 B1 * | 6/2003 | Brown et al. | ............. | 219/86.51 |
| 6,625,021 B1 * | 9/2003 | Lofland et al. | ............. | 165/80.3 |
| 6,657,859 B1 * | 12/2003 | Karr | ........................ | 165/104.21 |
| 6,717,813 B1 * | 4/2004 | Garner | ....................... | 361/700 |
| 6,745,824 B2 * | 6/2004 | Lee et al. | ............... | 165/104.33 |
| 6,830,098 B1 * | 12/2004 | Todd et al. | ............. | 165/104.33 |
| 6,861,293 B2 * | 3/2005 | Soule | ........................ | 438/122 |
| 6,915,844 B2 * | 7/2005 | Chou | ..................... | 165/104.33 |
| 6,918,429 B2 * | 7/2005 | Lin et al. | ..................... | 165/80.3 |
| 6,938,682 B2 * | 9/2005 | Chen et al. | ............. | 165/104.33 |
| 7,011,144 B2 * | 3/2006 | Zeighami et al. | ........ | 165/104.21 |
| 7,215,548 B1 * | 5/2007 | Wu et al. | ............... | 165/104.33 |
| 7,295,437 B2 * | 11/2007 | Lee et al. | ..................... | 361/700 |
| 7,298,620 B2 * | 11/2007 | Wu | .............................. | 361/700 |
| 7,327,576 B2 * | 2/2008 | Lee et al. | .................... | 165/80.4 |
| 7,331,379 B2 * | 2/2008 | Chen et al. | ............. | 165/104.33 |
| 7,347,251 B2 * | 3/2008 | Foster et al. | ........... | 165/104.33 |
| 7,401,642 B2 * | 7/2008 | Lo | .............................. | 165/80.3 |
| 2004/0035558 A1 | 2/2004 | Todd et al. | | |
| 2004/0050535 A1 | 3/2004 | Malone et al. | | |

* cited by examiner

*Primary Examiner*—Ljiljana (Lil) V Ciric
(74) *Attorney, Agent, or Firm*—Winston Hsu

(57) ABSTRACT

A heat dissipation device includes a fin set, first and second base plates and first and second heat pipes. The first base plate has a face for contacting a heat generating electronic device. The first heat pipe includes first and second sections sandwiching the fin set between the first and second sections and engaging with the fin set. The first and second base plates sandwich the first heat pipe and the fin set between the first and second base plates and engage with the first heat pipe and the fin set. The second heat pipe includes first and second sections sandwiching the first heat pipe, the fin set, the first and second base plates between the first and second sections of the second heat pipe and engaging with the first and second base plates.

17 Claims, 4 Drawing Sheets

HEAT DISSIPATION DEVICE WITH HEAT PIPES

FIELD OF THE INVENTION

The present invention relates to a heat dissipation device for use in removing heat from an electronic device, and more particularly to a heat dissipation device incorporating heat pipes for improving heat dissipation capacity thereof.

DESCRIPTION OF RELATED ART

During operation of an electronic device such as a computer central processing unit (CPU), a large amount of heat is often produced. The heat must be quickly removed from the electronic device to prevent it from becoming unstable or being damaged. Typically, a heat dissipation device is attached to an outer surface of the electronic device to absorb heat from the electronic device. The heat absorbed by the heat dissipation device is then dissipated to ambient air.

Conventionally, a heat dissipation device comprises a solid metal base attached on the electronic device, and a plurality of fins arranged on the base. The base is intimately attached on the electronic device thereby absorbing the heat generated by the electronic device. Most of the heat accumulated at the base is transferred firstly to the fins and then dissipated from the fins. However, the electronics technology continues to advance, and increasing amounts of heat are being generated by powerful state-of-the-art electronic devices. Many conventional heat dissipation devices are no longer able to efficiently remove heat from these electronic devices.

In order to overcome the above disadvantages of the heat dissipation device, one type of heat dissipation device used for the electronic device includes a heat pipe which can quickly transfer heat from a position to another position of the heat dissipation device. A heat pipe is a vacuum-sealed pipe that is filled with a phase changeable fluid, usually being a liquid, such as water, alcohol, acetone and so on, and has an inner wall thereof covered with a capillary configuration. As the electronic device heats up, a hot section usually called evaporating section of the heat pipe, which is located close to the electronic device also heats up. The liquid in the evaporating section of the heat pipe evaporates and the resultant vapor reaches a cool section usually called condensing section of the heat pipe and condenses therein. Then the condensed liquid flows to the evaporating section along the capillary configuration of the heat pipe. This evaporating/condensing cycle repeats and since the heat pipe transfers heat so efficiently, the evaporating section is kept at or near the same temperature as the condensing section of the heat pipe. Correspondingly, heat-transfer capability of the heat dissipation device including such a heat pipe is improved greatly.

Typically, a heat dissipation device illustrated as follows is used widely. The heat dissipation device comprises a base for contacting with a heat generating electronic device, a plurality of fins arranged on the base and two heat pipes thermally connecting the base and the fins. Each heat pipe is substantially U-shaped and has an evaporating section thermally positioned on the base and a condensing section substantially parallel to the evaporating section and thermally contacting an upper part of the fins, and a connecting section interconnecting the evaporating section and the condensing section. The two evaporating sections of the two heat pipes on the base of the heat sink are parallel to each other. In use, heat generated by the electronic device is absorbed by the base, and transferred from the base to a lower part of the fins and the evaporating sections of the heat pipes. The heat in the evaporating sections of the heat pipes is subsequently transmitted to the condensing sections and then the upper part of the fins and dissipated by the fins to ambient air. However, since the two heat pipes are parallel to each other and the evaporating sections of the two heat pipes are disposed very close to each other for being adjacent to the heat generating electronic component, the condensing portions of the heat pipes are also located close to each other. The proximity of the condensing portions is disadvantageous in view of the heat dissipation from the condensing portions of the heat pipes to the fins. A poor heat dissipation adversely affects functions and abilities of the electronic device. Therefore the heat dissipation device needs to be improved.

What is needed, therefore, is a heat dissipation device incorporating heat pipes having improved heat dissipation capability.

SUMMARY OF INVENTION

A heat dissipation device in accordance with a preferred embodiment of the present invention comprises a fin set comprising a plurality of fins, first and second base plates and first and second heat pipes. The first base plate has a bottom face for contacting with a heat generating electronic device. The first heat pipe comprises separate first and second sections sandwiching the fin set therebetween and thermally engaging with the fin set. The first and second base plates are parallel each other and sandwich the first heat pipe and the fin set therebetween and thermally engaging with the first heat pipe and the fin set. The second heat pipe comprises separate first and second sections sandwiching the first heat pipe, the fin set, the first and second base plates therebetween and thermally engaging with the first and second base plates. The first section of the first heat pipe and the first section of the second heat pipe are substantially perpendicular to each other, while the second section of the first heat pipe and the second section of the second heat pipe are substantially perpendicular to each other.

Other advantages and novel features will become more apparent from the following detailed description of preferred embodiments when taken in conjunction with the accompanying drawings, in which:

DETAILED DESCRIPTION

Figure 1:
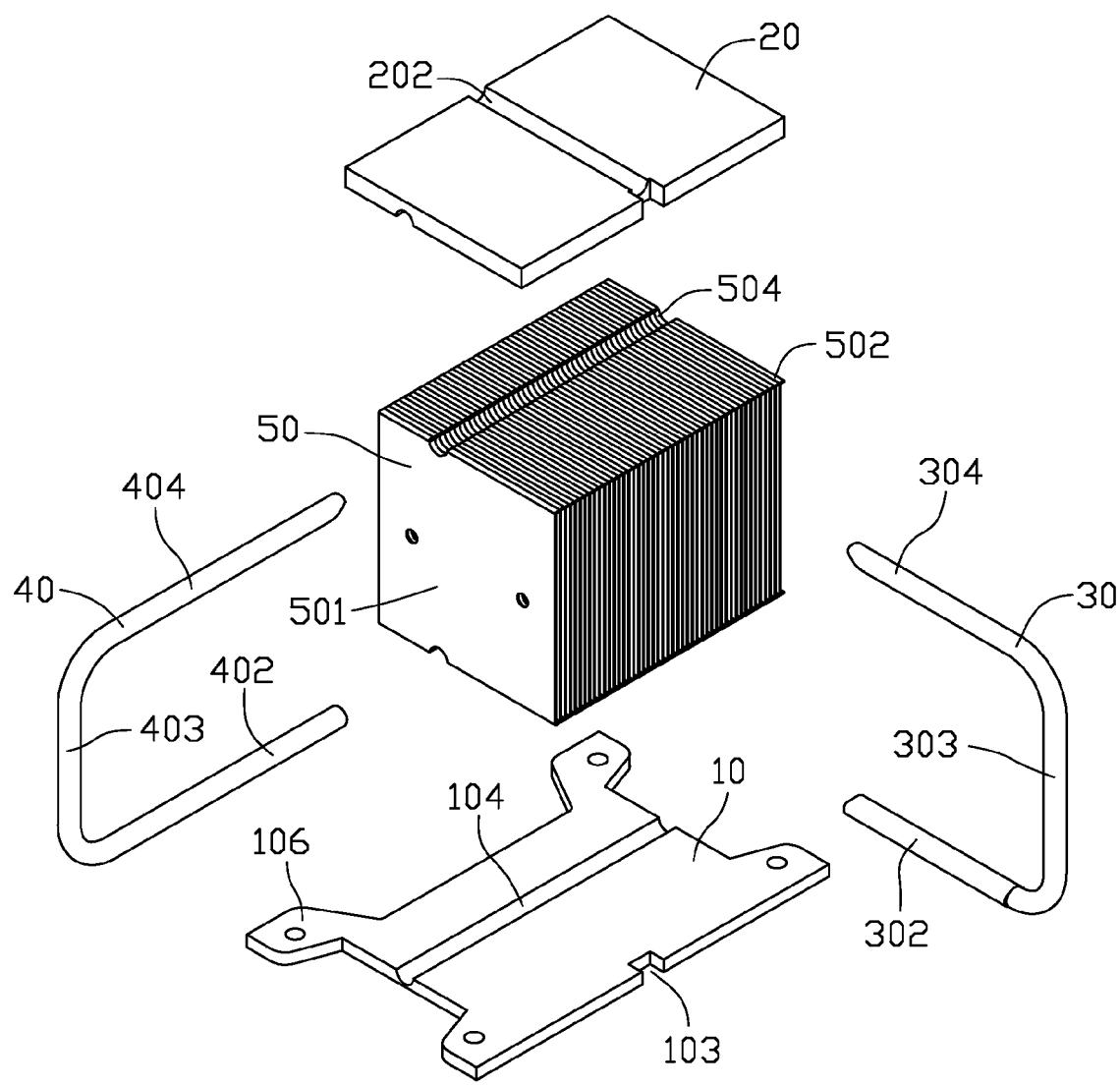
FIG. 1 is an exploded, isometric view of a heat dissipation device in accordance with a preferred embodiment of the present invention.

Referring to FIG. 1, a heat dissipation device according to a preferred embodiment of the present invention for dissipating heat generated by an electronic device (not shown) located on a printed circuit board (not shown) is shown. The heat dissipation device comprises a first base plate 10, a second base plate 20, a first heat pipe 30 and a second heat pipe 40 interconnecting the first base plate 10 and the second base plate 20, and a fin set thermally positioned between the first base plate 10 and the second base plate 20.

Figure 2:
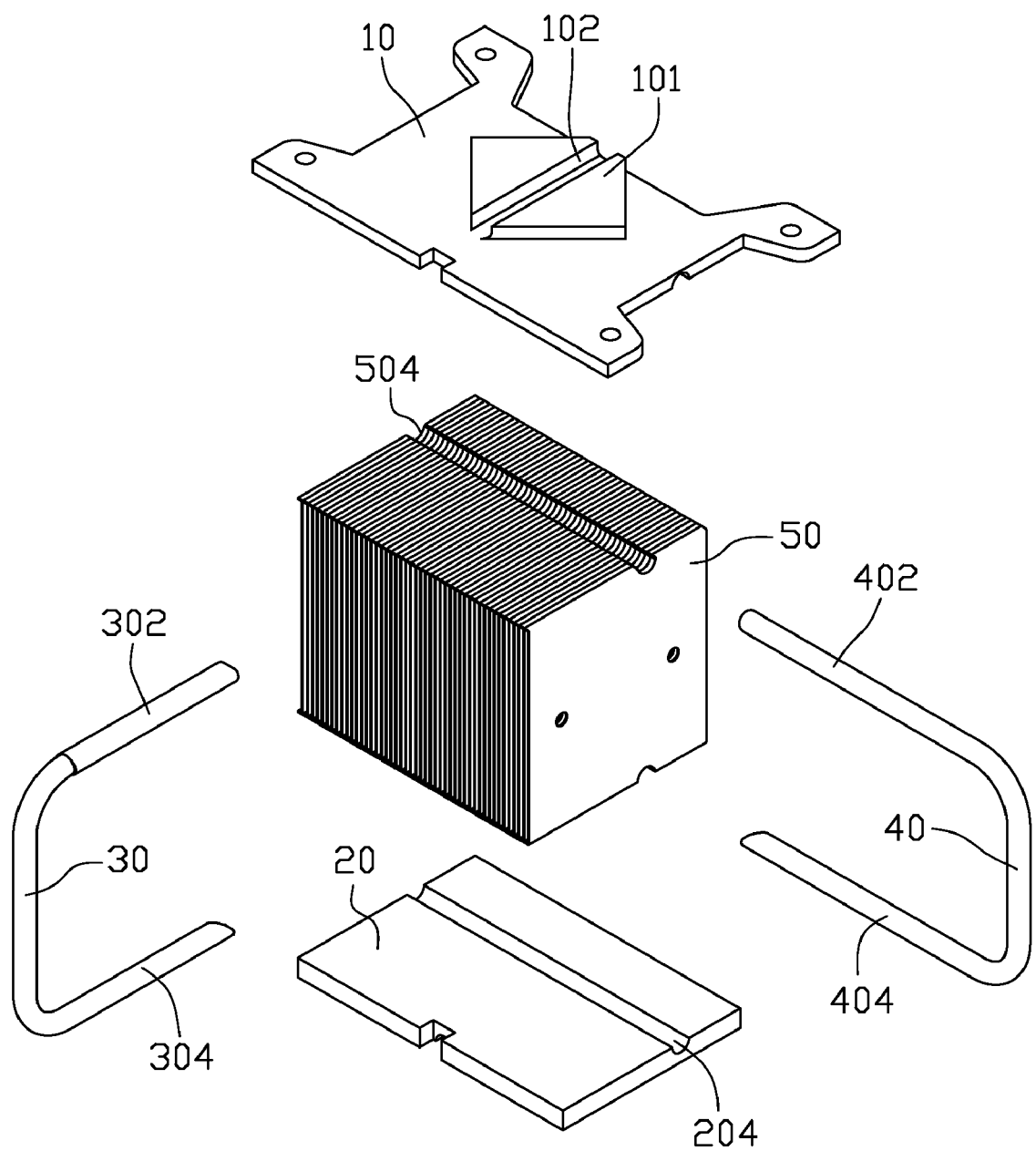
FIG. 2 is a view similar to FIG. 1, but viewed from a bottom aspect.

Referring also to FIG. 2, the first base plate 10 is a substantially rectangular plate which has a high heat conductivity. The first base plate 10 has a protrusion 101 extending from a bottom face thereof for contacting with the electronic device. A horizontal groove 102 is defined in the protrusion 101 for receiving first heat pipe 30. A side of the first base plate 10 defines a cutout 103 aligned with the groove 102. A top face of the first base plate 10 defines a longitudinal groove 104 with a semicircular cross section. The longitudinal groove 104 is oriented perpendicular to the horizontal groove 102. An intersection of the grooves 102, 104 in the first base plate 10 is substantially located in a center of first base plate 10, which is used for contacting with the heat generating electronic device. Four fixing legs 106 respectively extend from four corners of the first base plate 10 for fixing the heat dissipation device to the printed circuit board.

The second base plate 20 is a substantially rectangular plate having a high heat conductivity. The second base plate 20 has a groove 202 defined in a top face thereof, and a groove 204 perpendicular to the groove 202 defined in a bottom face thereof.

The fin set comprises a plurality of fins 50 assembled together. The fins 50 are parallel to and spaced from each other and sandwiched between the first base plate 10 and the second base plate 20. Each of the fins 50 has a body 501 and two flanges 502 perpendicularly extending from top and bottom edges of the body 501. The flanges 502 of each fin 50 abut against corresponding edges of the body 501 of an adjacent fin 50. The flanges 502 of the fins 50 are concaved to corporately define two grooves 504 each with a semicircular cross section at the top and bottom of the fin set, respectively. The two grooves 504 are parallel to each other. A lower one of the two grooves 504 and the groove 104 of the first base plate 10 cooperatively define a first channel (not labeled). A top one of the two grooves 504 and the groove 204 of the second base plate 20 corporately define a second channel (not labeled). The two channels are for receiving the second heat pipe 40.

Figure 4:
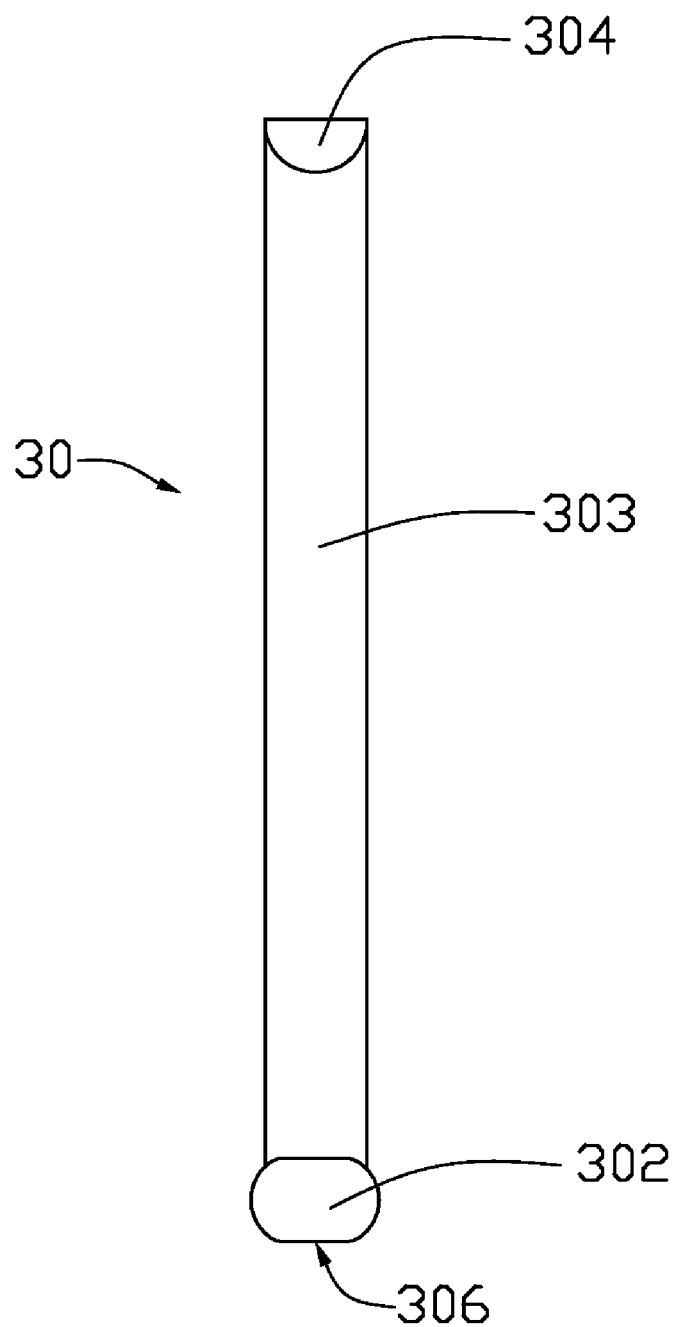
FIG. 4 is a side view of a first heat pipe of the heat dissipation device of FIG. 1.

The first and second heat pipes 30, 40 each are U-shaped and respectively comprise a first section 302, 402, a second section 304, 404 parallel to the first section 302, 402, and a connecting section 303, 403 interconnecting the corresponding first and second sections 302, 304, 402, 404. Also referring to FIG. 4, the first and second sections 302, 304 of the first heat pipe 30 are substantially flat. A flat bottom face 306 of the first section 302 of the first heat pipe 30 is coplanar with a bottom face of the protrusion 101. The first sections 302, 402 of the heat pipes 30, 40 are evaporating sections for receiving the heat from the heat generating electronic device. The second sections 304, 404 are condensing sections for releasing the heat to the fins.

Figure 3:
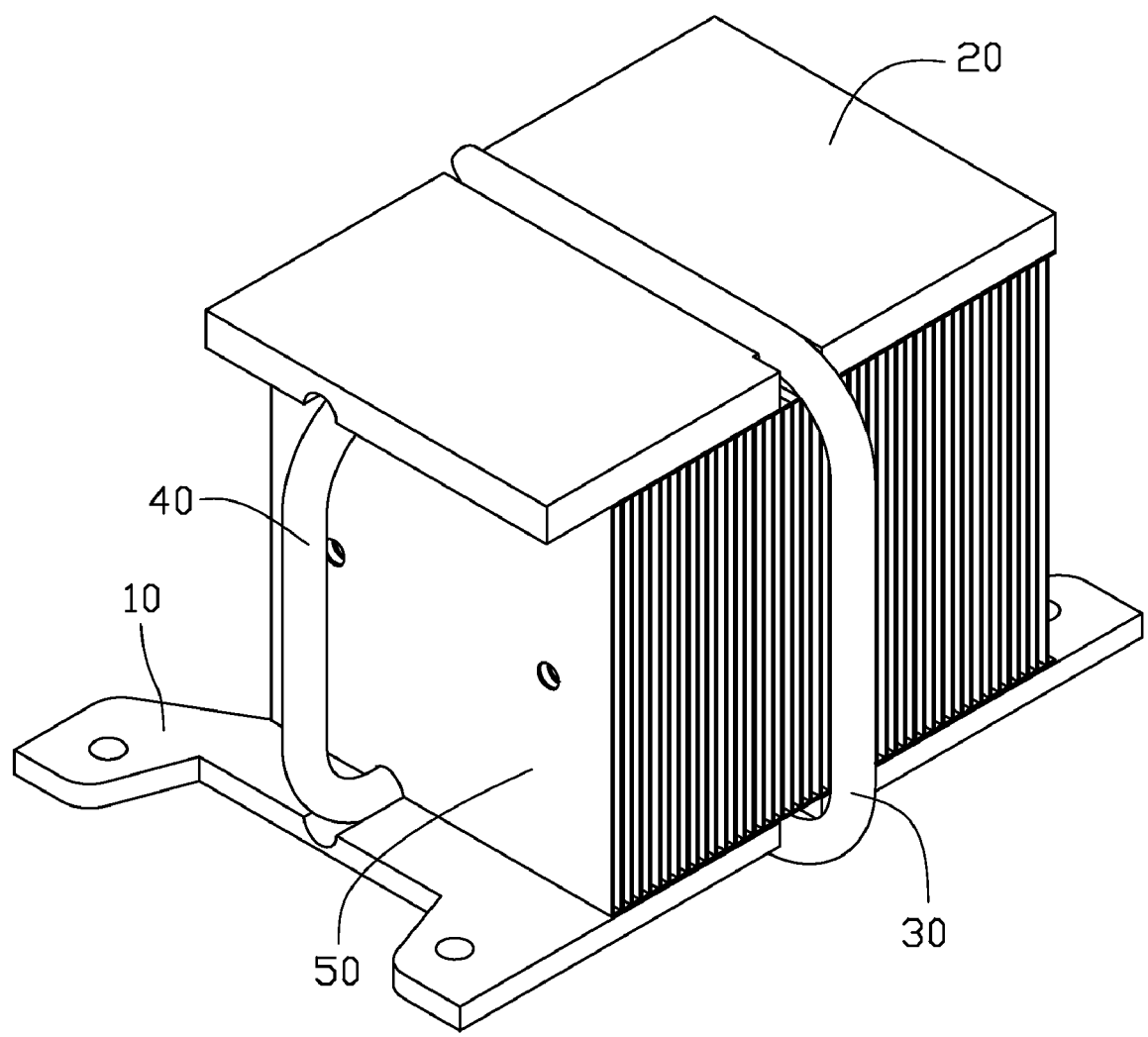
FIG. 3 is an assembled view of FIG. 1.

Referring to FIG. 3, the first heat pipe 30 has the first section 302 thereof thermally combined to the groove 102 of the first base plate 10, and the second section 304 thereof thermally combined to the groove 202 of the second base plate 20. The second heat pipe 40 has the first section 402 thereof thermally combined to the groove 104 of the first base plate 10 and the lower groove 504 of the fin set, and the second section 404 thermally combined to the groove 204 of the second base plate 20 and the upper groove 504 of the fin set. The first sections 302, 402 of the two heat pipes 30, 40 are intersected around the center of the first base plate 10. The second sections 304, 404 of the two heat pipes 30, 40 are intersected on the second base plate 20.

In use, the heat generated by the electronic device is absorbed by the protrusion 101 of the first base plate 10 and the first section 302 of the first heat pipe 30. The heat in the protrusion 101 is conducted to a top of the first base plate 10 and is absorbed by the first section 402 of the second heat pipe 40. Sequentially, the heat in the first sections 302, 402 of the first and second heat pipes 30, 40 is transferred to the second sections 304, 404 of the first and second heat pipes 30, 40 via the connecting sections 303, 403 of the first and second heat pipes 30, 40. Then the heat in the second sections 304, 404 reaches the second base plate 20 and the fin set; ultimately, the heat is dissipated to ambient air by the fins 50 and the second base plate 20.

According to the preferred embodiment of the present invention, the first sections 302, 402 of the first and second heat pipes 30, 40 which are positioned in the first base plate 10 are crossed with each other with the intersection thereof being located just above the electronic device; therefore, the heat of the electronic device can be directly and very quickly transferred to the first sections 302, 402 of the heat pipes 30, 40. Furthermore, since the second sections 304, 404 of the heat pipes 30, 40 are crossed with each other at the second base plate 20, the second sections 304, 404 are distantly spaced from each other, except portions near the intersection thereof. Thus, the second sections 304, 404 can sufficiently release the heat from the first sections 302, 402 to the fins 50 and the second base plate 20. Furthermore, since the connecting sections 303, 403 of the heat pipes 30, 40 are spaced from each other a large distance, the transfer of the heat from the first sections 302, 402 to the second sections 304, 404 can be more efficiently achieved, without the disadvantages of the prior art wherein the connecting sections are closely parallel to each other, which may result in an interference between the heat transfer therethrough.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a base having a first face and a second face opposite to the first face;
   a fin set comprising a plurality of fins arranged on the first face of the base;
   a first heat pipe having a first section positioned to and thermally connecting with the second face of the base; and
   a second heat pipe having a first section positioned to and thermally connecting with the first face of the base and substantially perpendicular to the first section of the first heat pipe;
   wherein a protrusion extends from the second face of the base, and wherein the first section of the first heat pipe is combined to and thermally connects with the protrusion; and
   wherein the protrusion of the base has a groove extending therethrough, and the first section of the first heat pipe is received in the groove.

2. The heat dissipation device of claim 1, wherein the first section of the first heat pipe has a flat face coplanar with a face of the protrusion of the base for contacting with a heat generating device.

3. The heat dissipation device of claim 1, wherein the first face of the base defines a groove substantially extending therethrough and perpendicular to the groove of the protrusion of the base.

4. The heat dissipation device of claim 1 further comprising a second base plate, wherein the second base plate has a first face contacting with the fin set.

5. The heat dissipation device of claim 4, wherein the first face of the second base plate and the fin set corporately define a channel between the first face of the second base plate and the fin set, and wherein the second heat pipe has a second section received in the channel and thermally connecting with the second base plate and the fin set.

6. The heat dissipation device of claim 5, wherein the second heat pipe has a connecting section interconnecting the first section and the second section of the second heat pipe.

7. The heat dissipation device of claim 4, wherein the first heat pipe has a second section contacting with a second face opposite to the first face of the second base plate.

8. The heat dissipation device of claim 7, wherein the second face of the second base plate defines a groove therein, the second section of the first heat pipe being received in the groove and thermally connecting with the second base plate.

9. The heat dissipation device of claim 7, wherein the first heat pipe has a connecting section interconnecting the first section and the second section of the first heat pipe.

10. A heat dissipation device comprising:

a fin set;

a first heat pipe comprising separate first and second sections sandwiching the fin set between the first and second sections of the first heat pipe and engaging with the fin set;

parallel first and second base plates sandwiching the first heat pipe and the fin set between the first and second base plates and engaging with the first heat pipe and the fin set; and a second heat pipe comprising separate first and second sections sandwiching the first heat pipe, the fin set, the first and second base plates between the first and second sections of the second heat pipe and engaging with the first and second base plates;

wherein a protrusion extends from the first base plate opposite to the second base plate; and wherein the protrusion of the first base plate has a groove extending therethrough, and the first section of the second heat pipe is flat and received in the groove and thermally connects with the protrusion.

11. The heat dissipation device of claim 10, wherein the first section of the second heat pipe has a flat bottom face which is coplanar with an outmost face of the protrusion of the first base plate.

12. The heat dissipation device of claim 10, wherein the first section of the first heat pipe is substantially perpendicular to the first section of the second heat pipe in the protrusion of the first base plate.

13. The heat dissipation device of claim 12, wherein the second section of the first heat pipe is substantially perpendicular to the second section of the second heat pipe in the second base plate.

14. A heat dissipation device comprising:

a heat dissipation unit having a base adapted for thermally connecting with a heat generating electronic device and a plurality of fins;

a first heat pipe having a first evaporating section thermally connecting with the base and a first condensing section thermally connecting with the fins; and a second heat pipe having a second evaporating section thermally connecting with the base and a second condensing section thermally connecting the fins, wherein the first and second evaporating sections are crisscross.

15. The heat dissipation device of claim 14, wherein the first and second condensing sections are crisscross.

16. The heat dissipation device of claim 15, wherein each of the first and second heat pipes has a U-shaped configuration.

17. The heat dissipation device of claim 14, wherein the first and second evaporating sections are located at different levels, respectively.

* * * * *

UNITED STATES PATENT AND TRADEMARK OFFICE
CERTIFICATE OF CORRECTION

PATENT NO. : 7,597,133 B2  Page 1 of 1
APPLICATION NO. : 11/306359
DATED : October 6, 2009
INVENTOR(S) : Lee et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 770 days.

Signed and Sealed this

Twenty-eighth Day of September, 2010

David J. Kappos
*Director of the United States Patent and Trademark Office*